United States Patent
Göhringer

[19]

[11] Patent Number: 5,909,186

[45] Date of Patent: Jun. 1, 1999

[54] METHODS AND APPARATUS FOR TESTING ANALOG-TO-DIGITAL AND DIGITAL-TO-ANALOG DEVICE USING DIGITAL TESTERS

[75] Inventor: Reiner Göhringer, Kirchheim, Germany

[73] Assignee: VLSI Technology GmbH, Germany

[21] Appl. No.: 08/886,252

[22] Filed: Jul. 1, 1997

[51] Int. Cl.[6] ................................ H03M 1/10
[52] U.S. Cl. .................... 341/120; 341/144; 341/155
[58] Field of Search ................................ 341/120, 119, 341/110, 155, 144

[56] References Cited

U.S. PATENT DOCUMENTS

| | | |
|---|---|---|
| 4,118,698 | 10/1978 | Becker . |
| 4,354,177 | 10/1982 | Sloane . |
| 4,504,741 | 3/1985 | Armitage . |
| 4,758,781 | 7/1988 | Ueno et al. . |
| 5,063,383 | 11/1991 | Bobba . |
| 5,081,592 | 1/1992 | Jenq ................................ 364/487 |
| 5,132,685 | 7/1992 | DeWitt et al. . |
| 5,659,312 | 8/1997 | Sunter et al. ................. 341/120 |

*Primary Examiner*—Marc S. Hoff
*Assistant Examiner*—Peguy JeanPierre
*Attorney, Agent, or Firm*—Burns, Doane, Swecker & Mathis LLP

[57] ABSTRACT

Methods and apparatus for coupling a digital tester to a mixed-signal device under test. In exemplary embodiments, a digital tester interface communicates with a digital tester and a device under test, and performs analog-to-digital and digital-to-analog translations between the digital tester and the device under test, so that delays associated with prior art testing systems are significantly reduced. The digital tester interface of the present invention is properly viewed as a hardware accelerator enabling quick and cost effective quality-testing of mixed-signal devices using inexpensive digital testers. Because the digital tester interface reduces per-function test time by an order of magnitude as compared to prior art systems, mixed-signal devices are more thoroughly tested and quality assurance levels are maximized at minimal additional cost. Furthermore, because analog-to-digital and digital-to-analog conversions are performed external to a digital tester, performance calculations are carried out at a much higher resolution as compared to prior art systems.

23 Claims, 12 Drawing Sheets

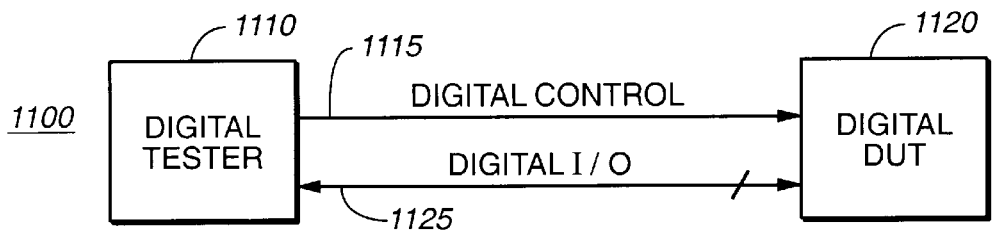
FIG._1A (PRIOR ART)
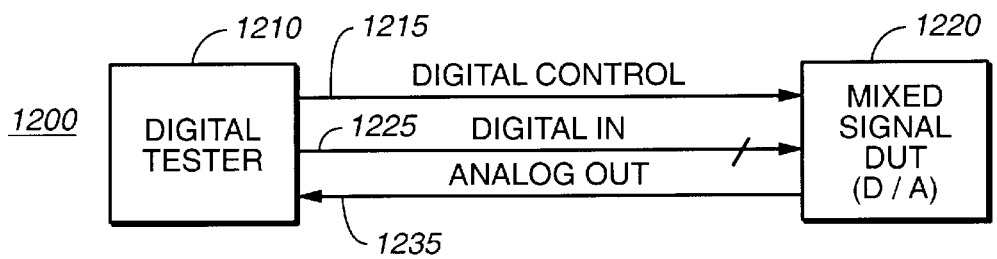
FIG._1B (PRIOR ART)
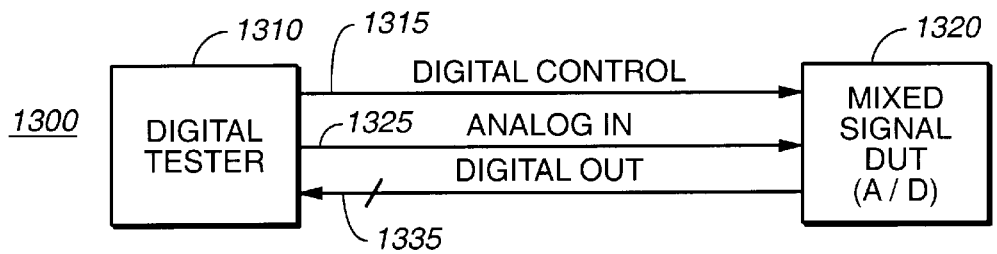
FIG._1C (PRIOR ART)
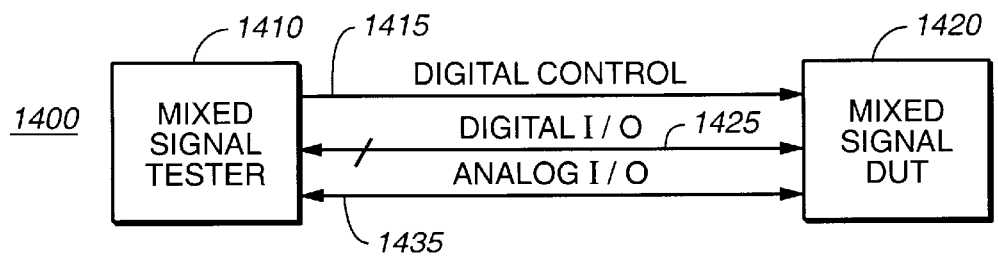
FIG._1D (PRIOR ART)

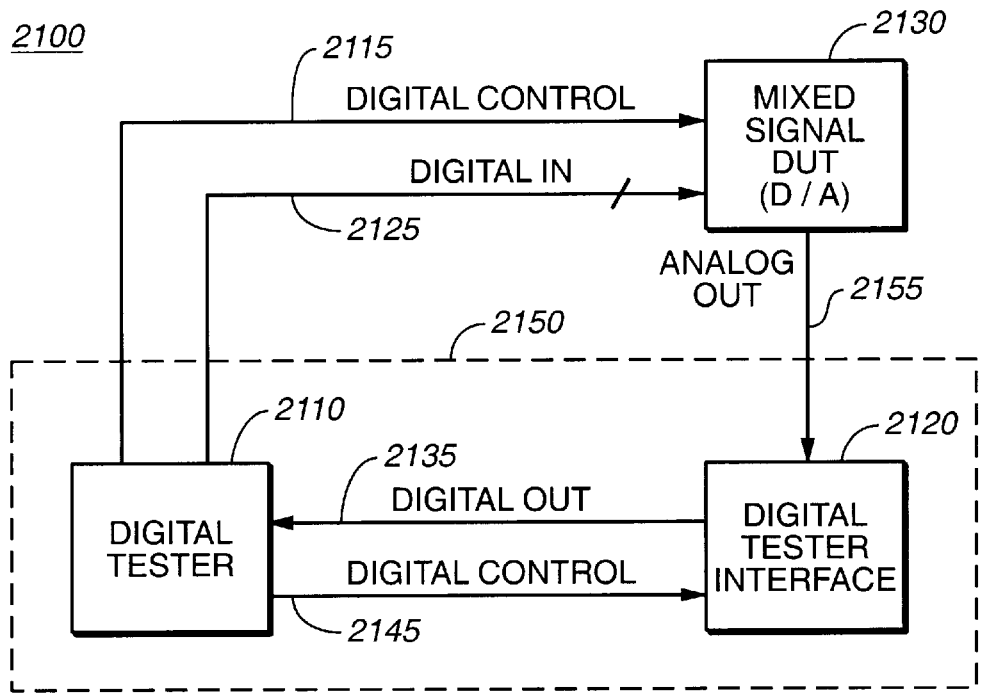
FIG._2A
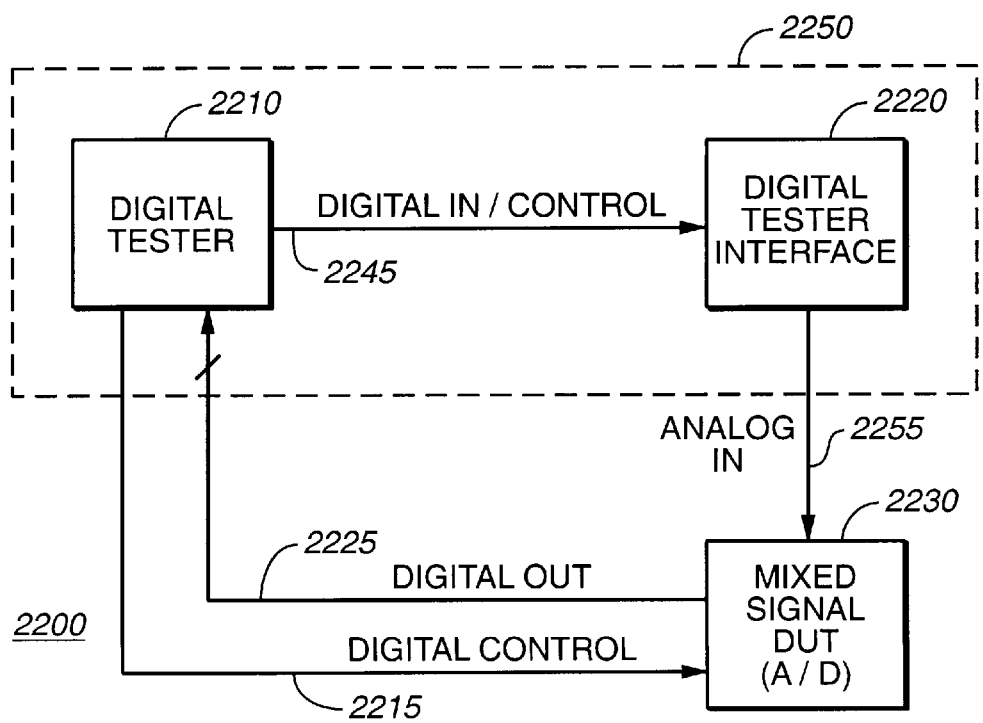
FIG._2B

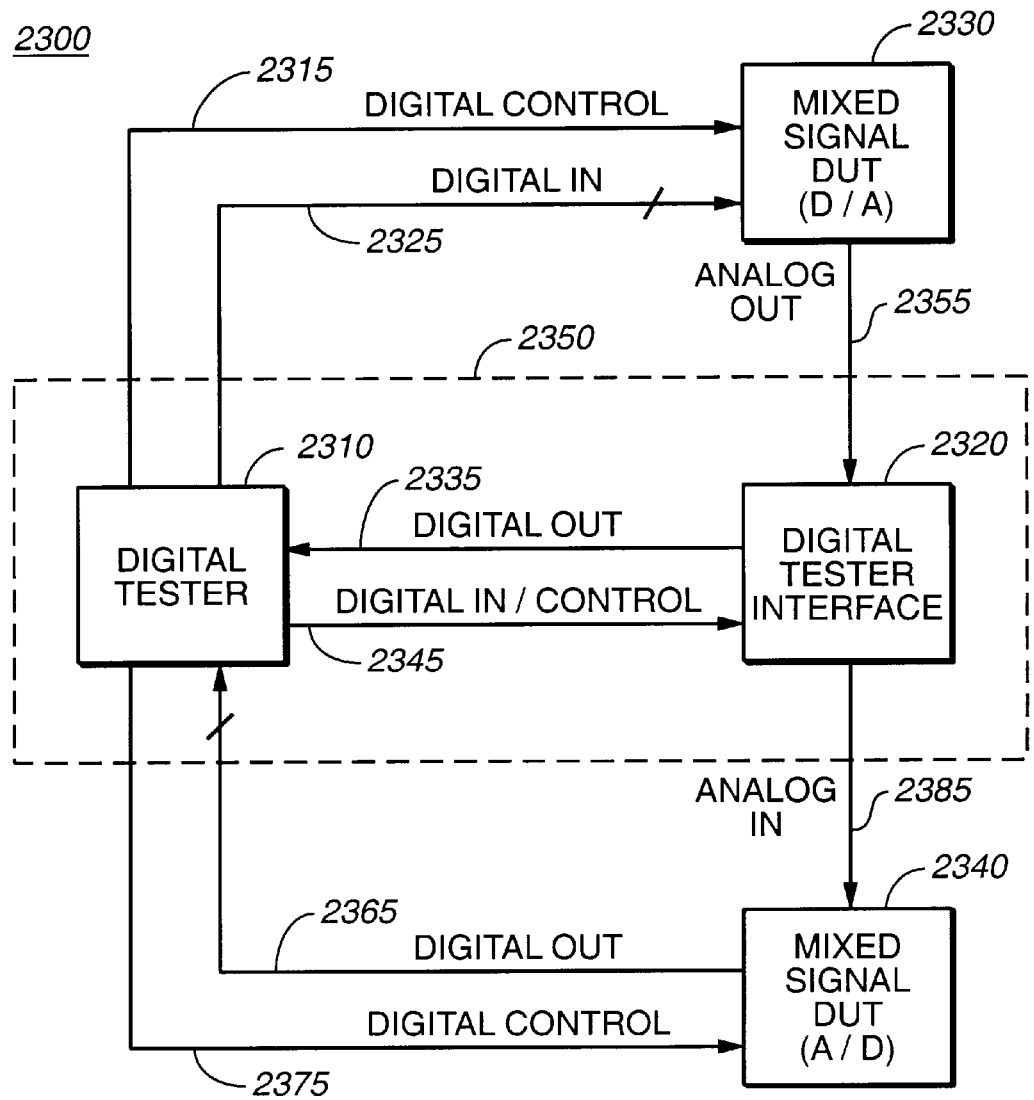
FIG._2C

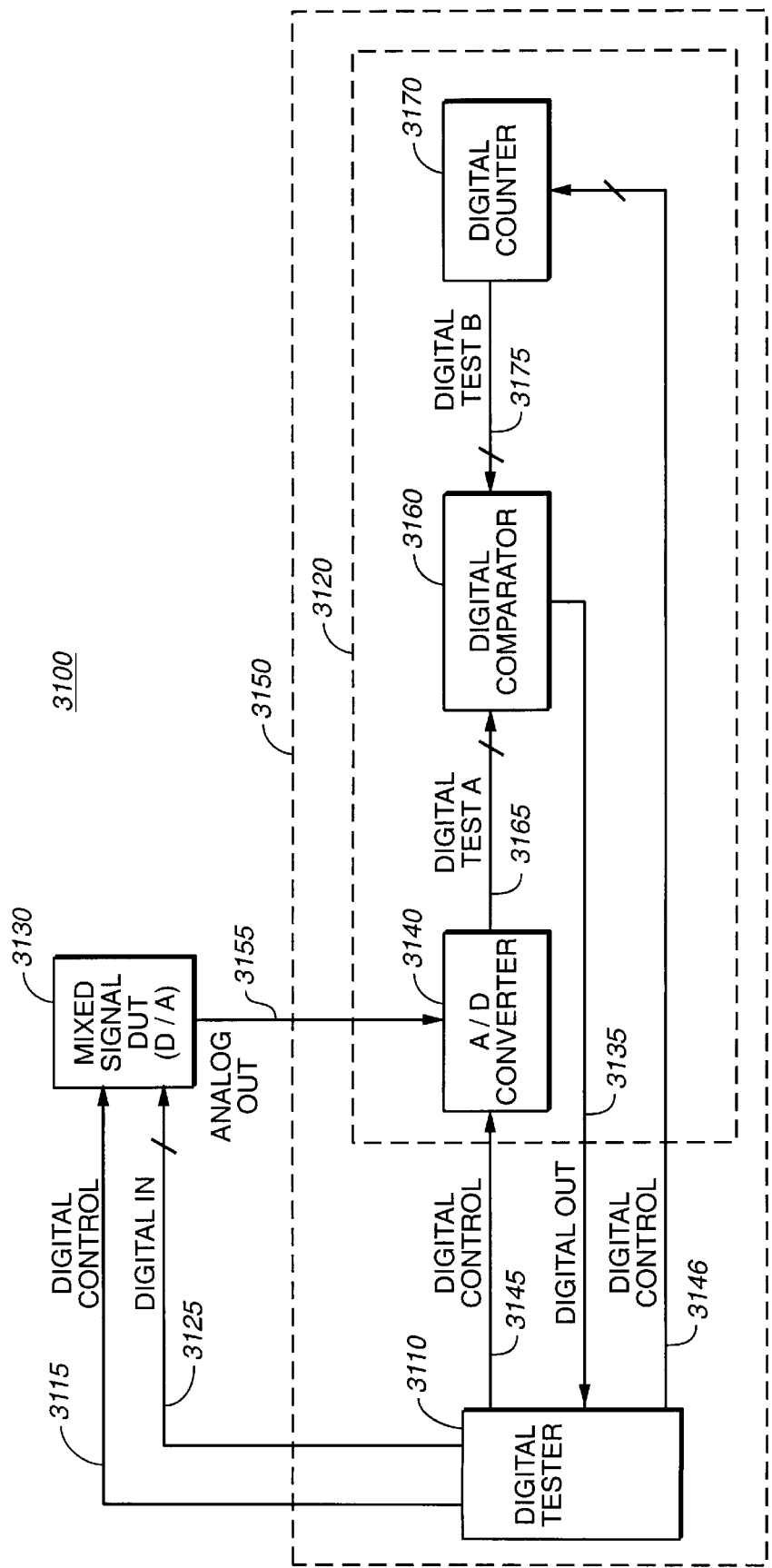
FIG._3A

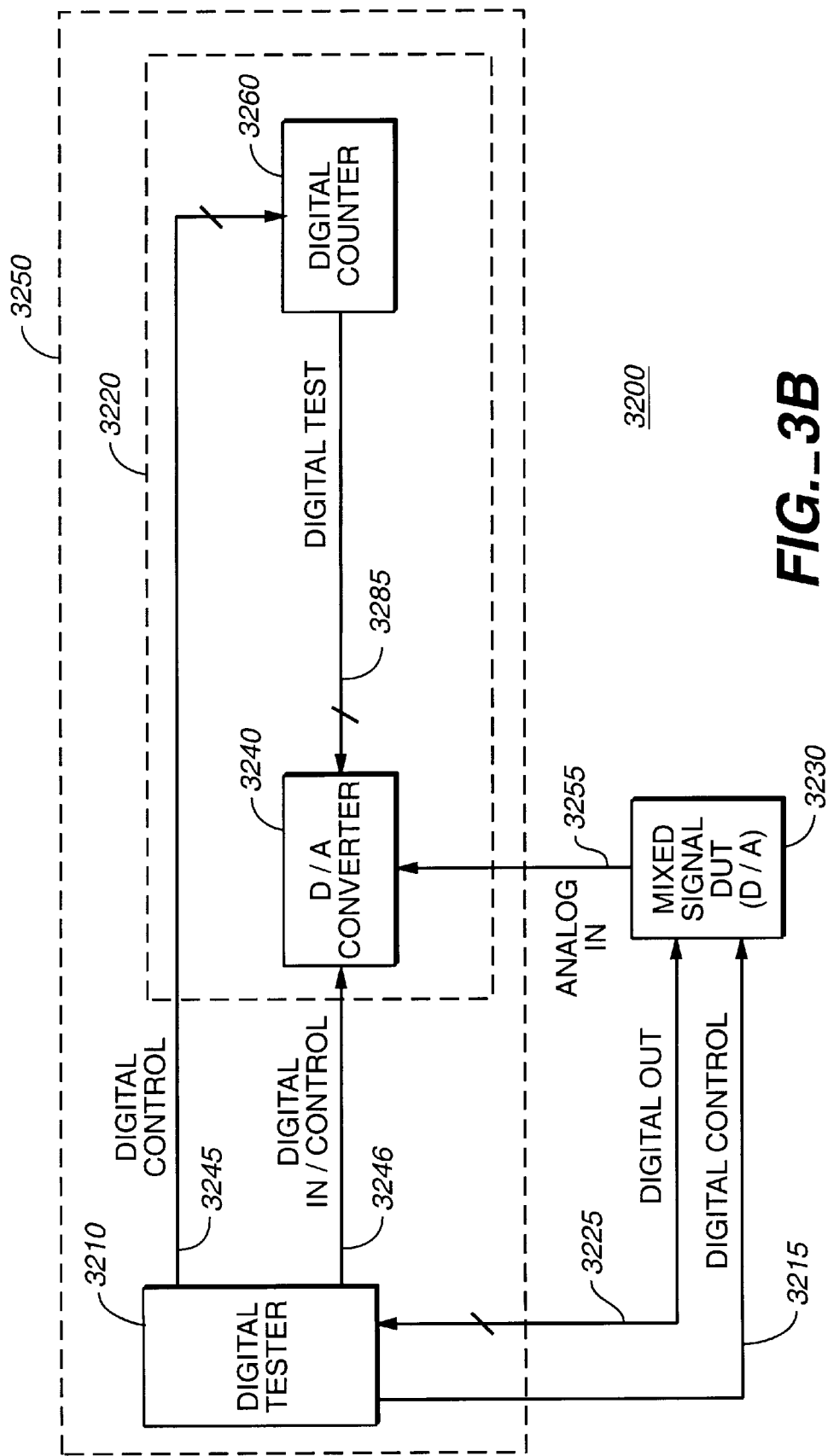

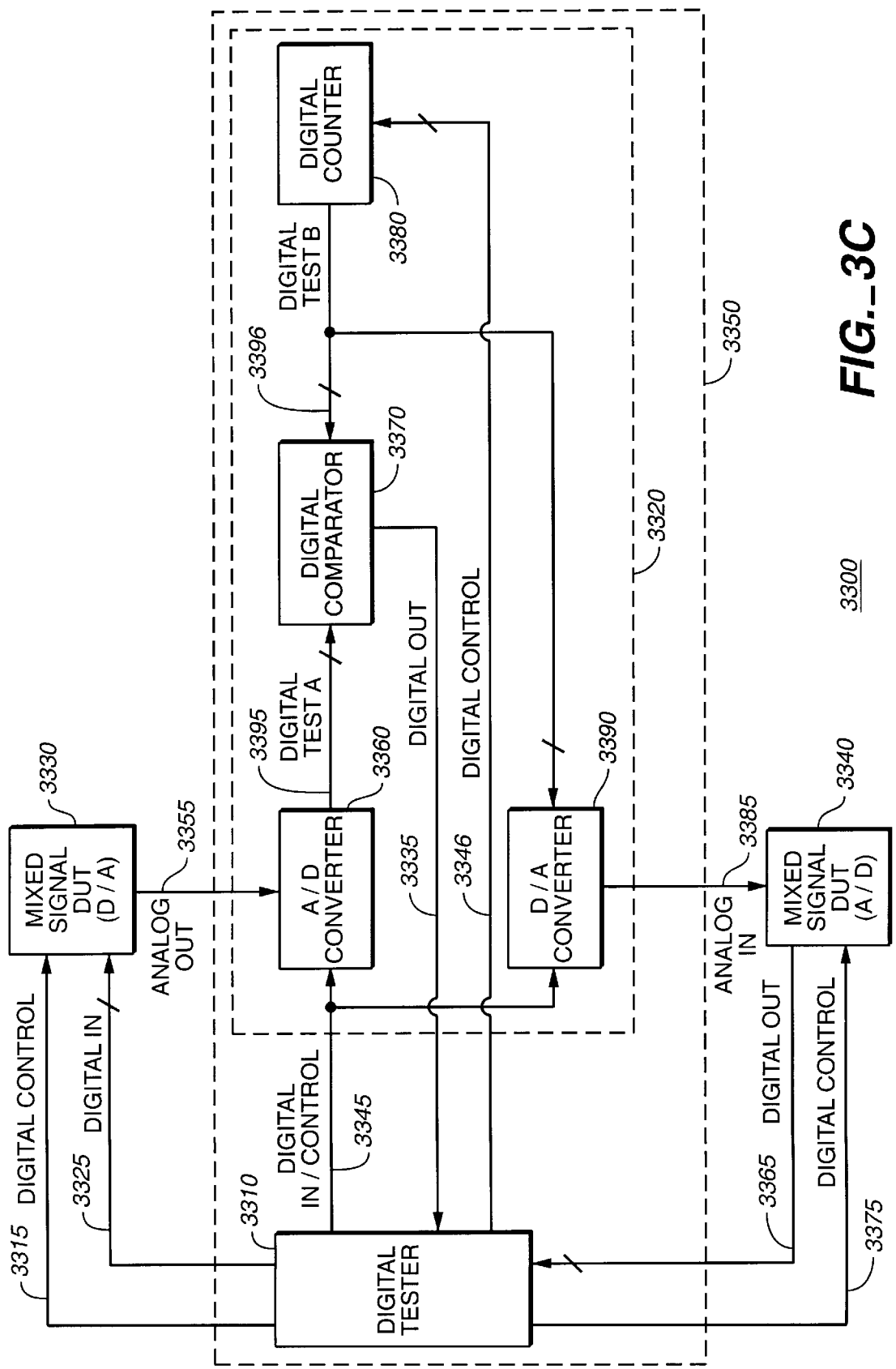
FIG._3C

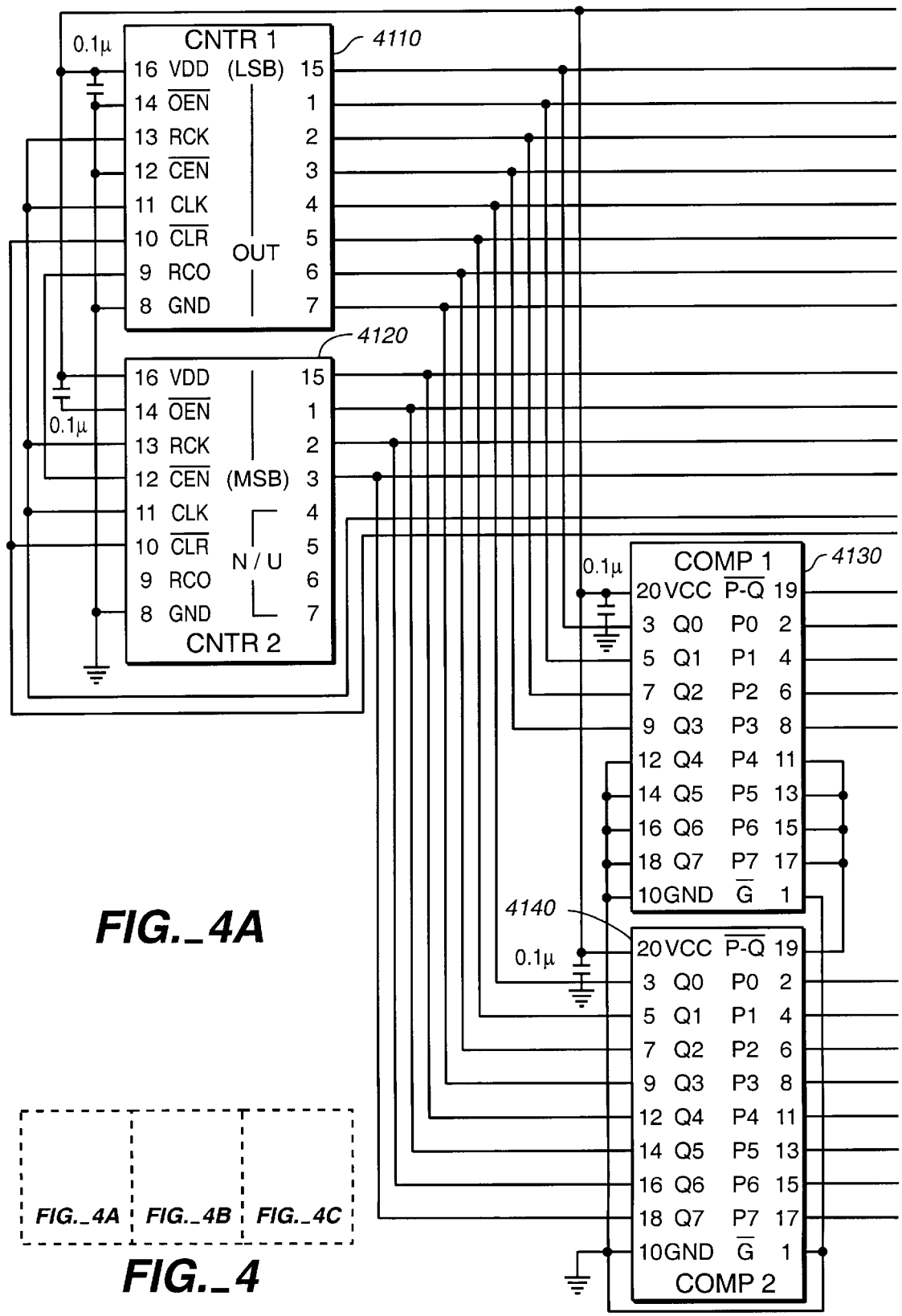
FIG._4A
FIG._4
FIG._4A | FIG._4B | FIG._4C

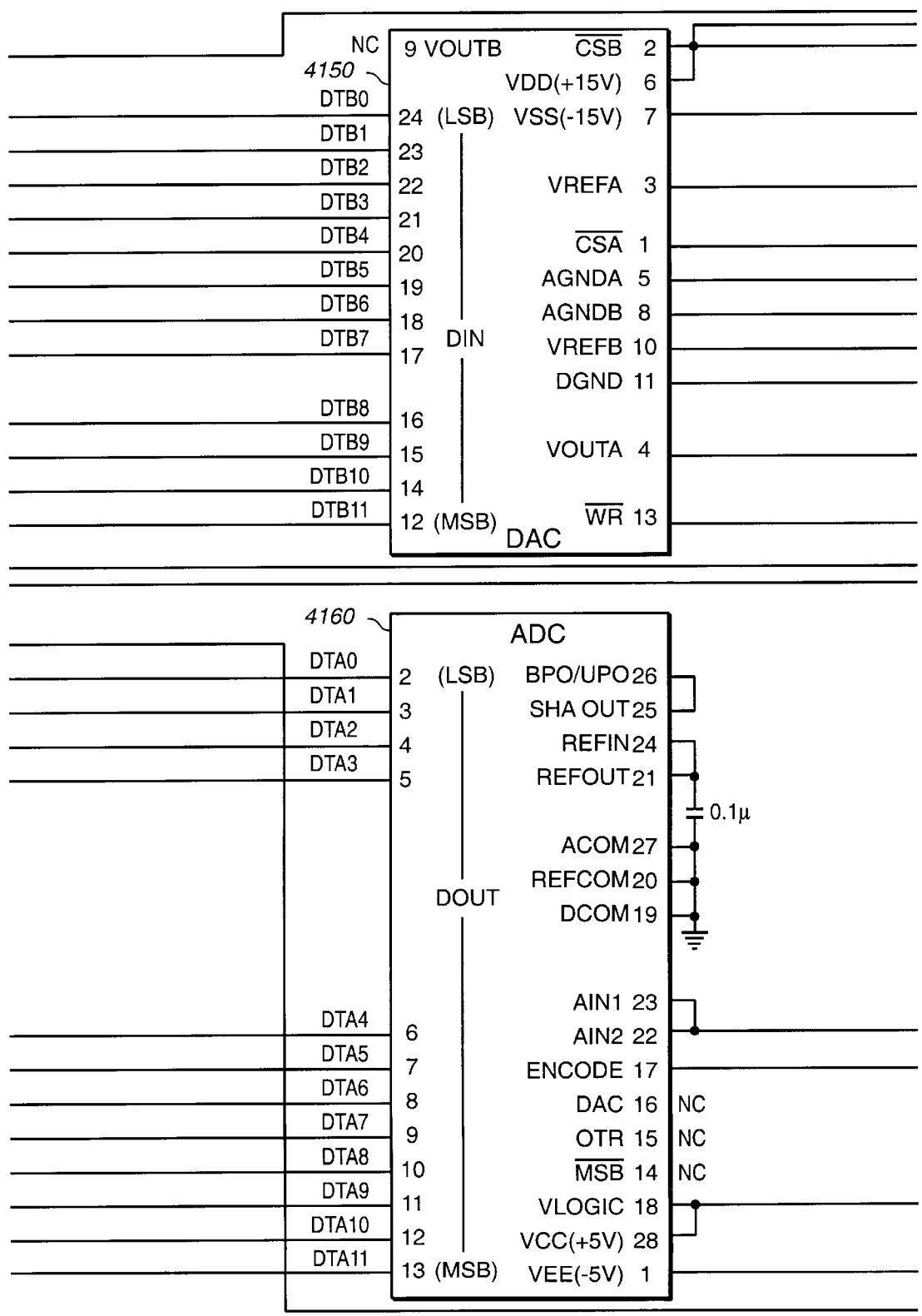
FIG._4B

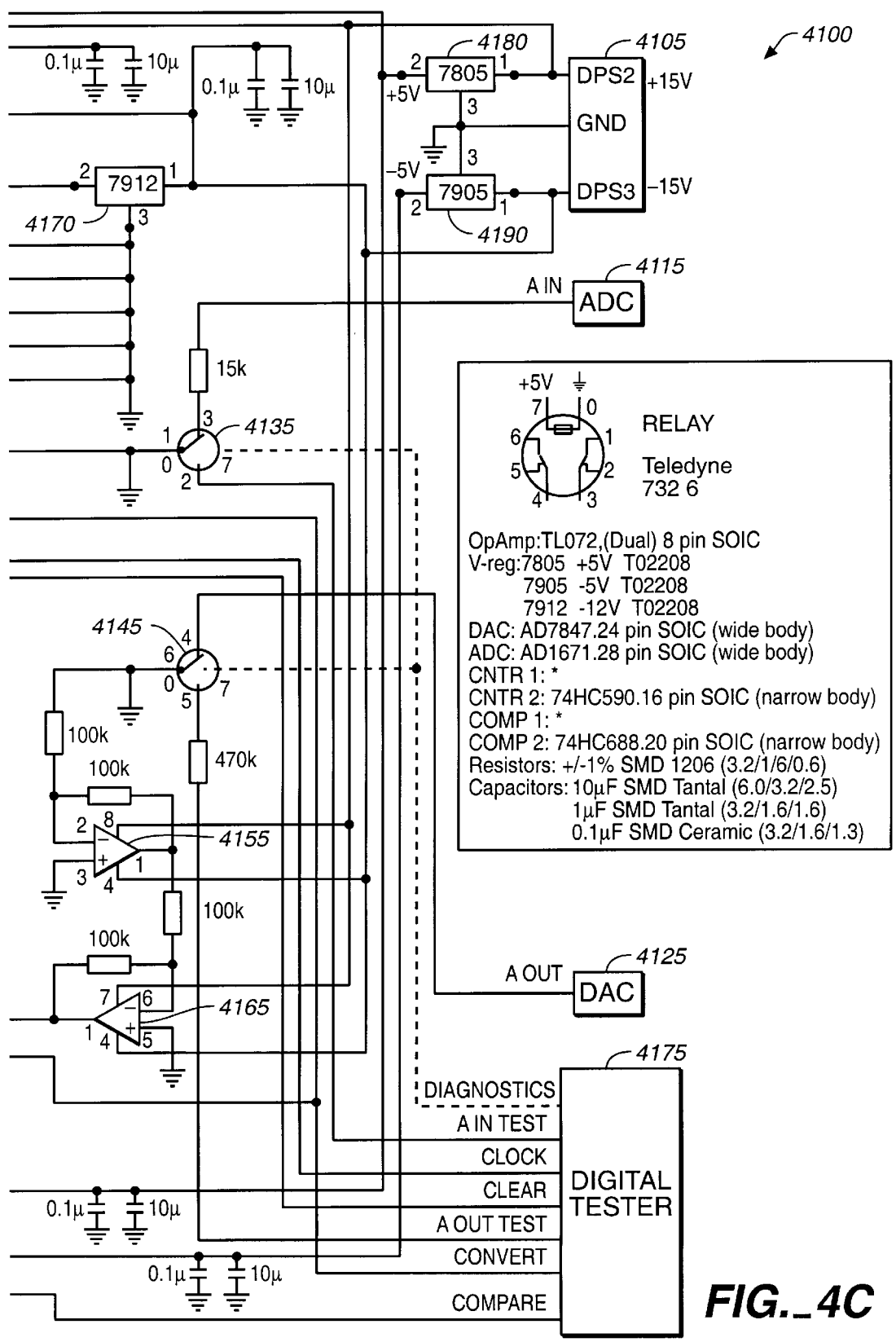
FIG._4C

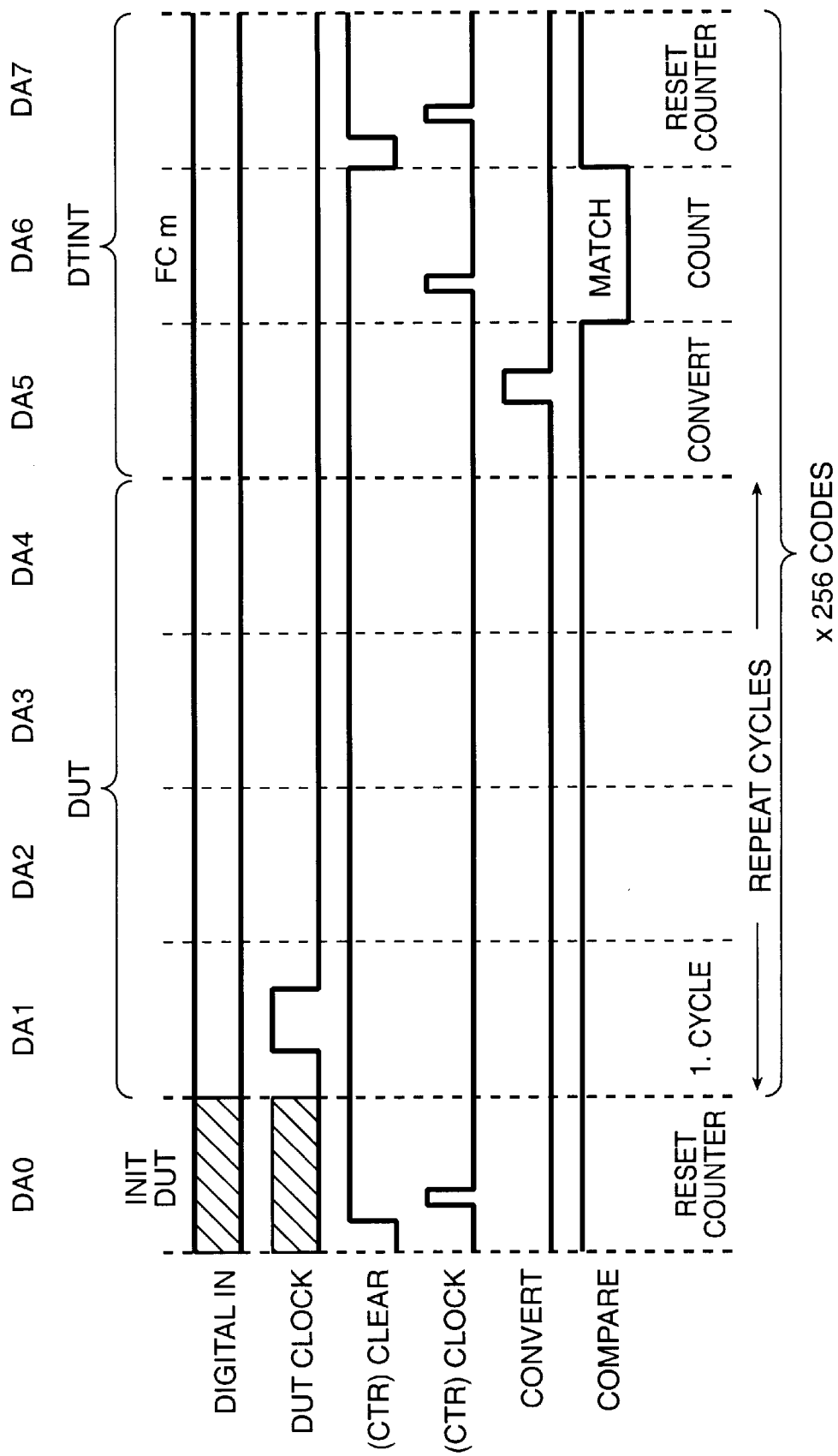
FIG._5A

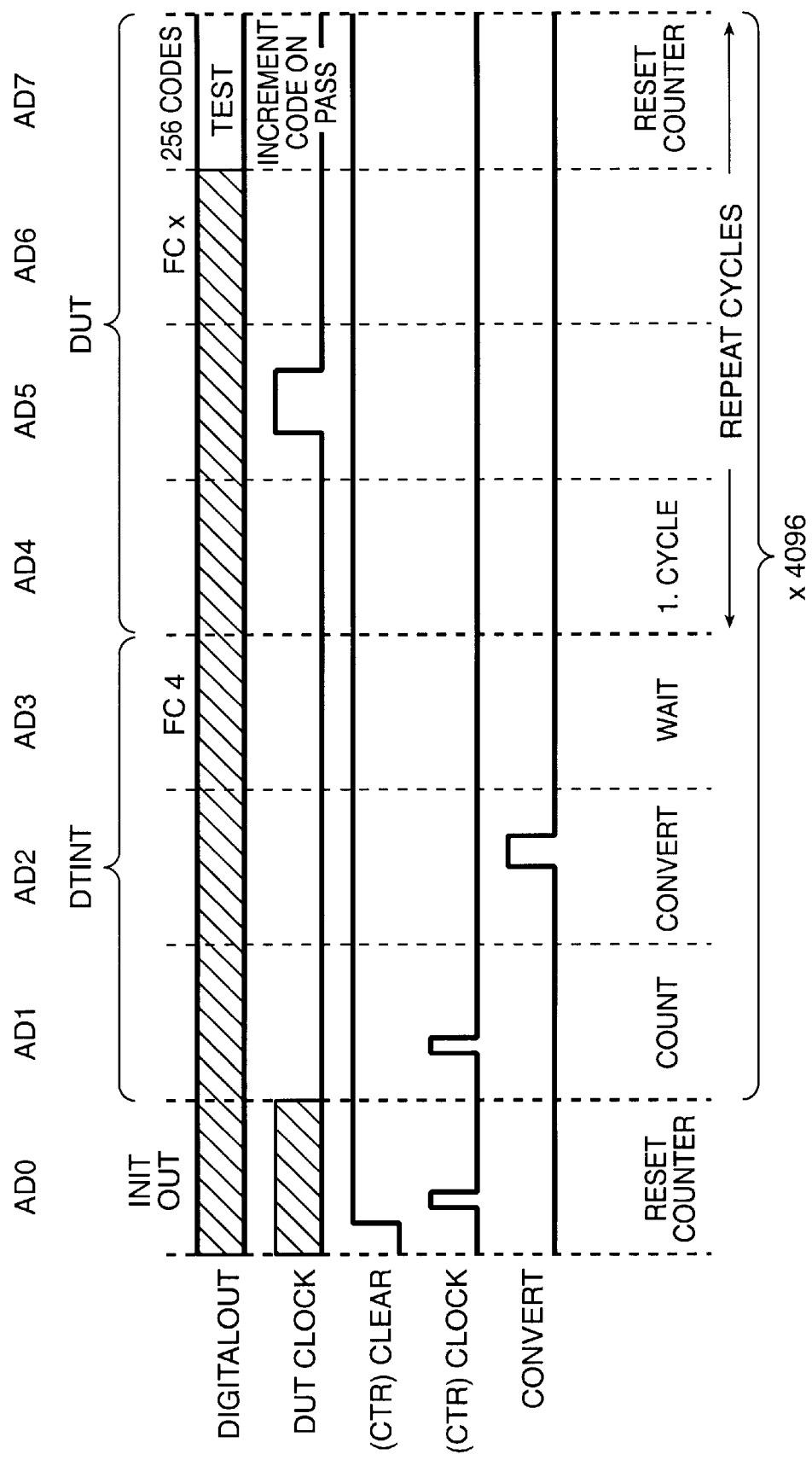
FIG._5B

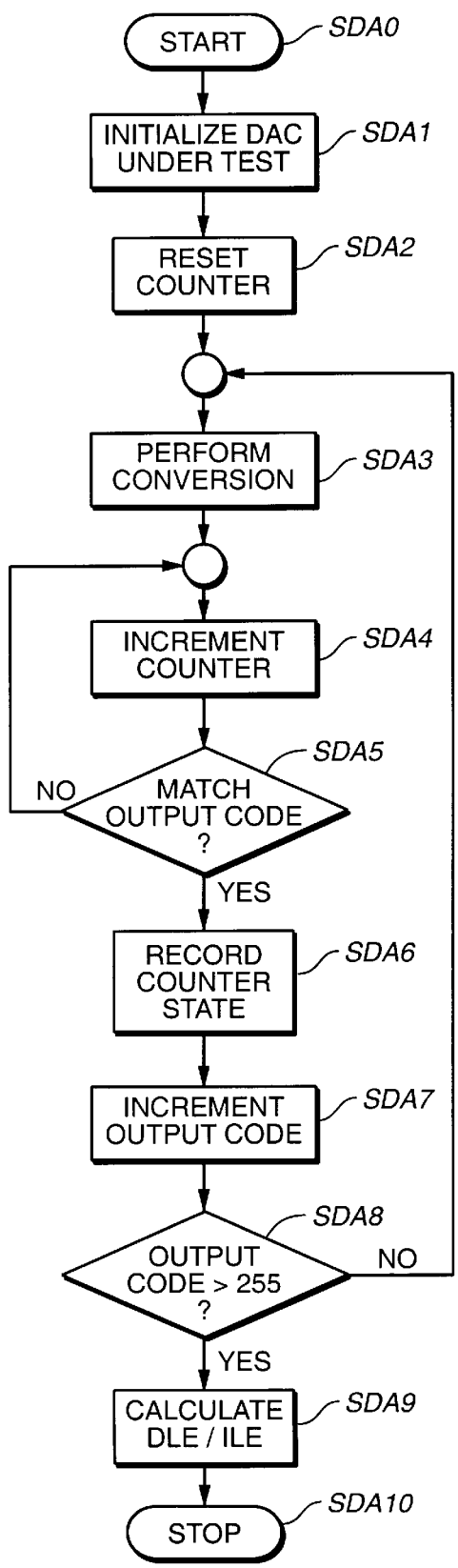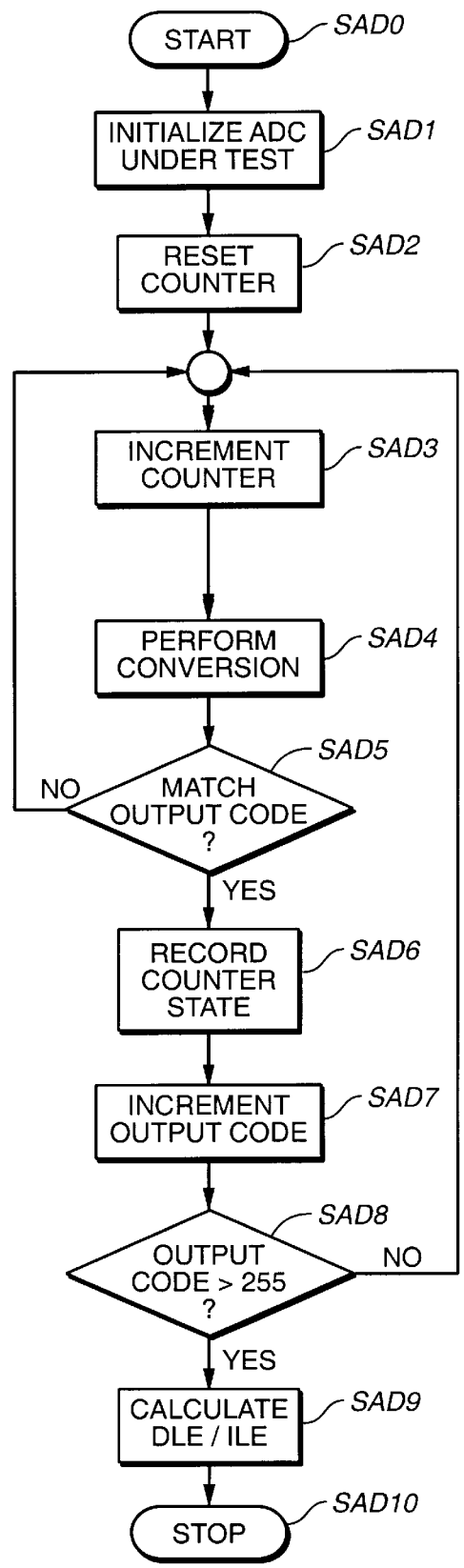
*FIG._6A*     *FIG._6B*

METHODS AND APPARATUS FOR TESTING ANALOG-TO-DIGITAL AND DIGITAL-TO-ANALOG DEVICE USING DIGITAL TESTERS

BACKGROUND OF THE INVENTION

1. Field of the Invention

The present invention relates to production testing of electronic devices, and more particularly to production testing of devices designed to operate on analog or digital signals.

2. State of the Art

One aspect of electronic device manufacturing is that electronic devices are quality-tested during production. Today, electronic testing equipment is available for testing a wide variety of parts for an equally wide variety of performance characteristics. Typically, computer-based testers are programmed to put a device through a series of tests and to then evaluate whether the device meets predefined performance criteria. If a device under test (DUT) does not meet the criteria, the device is typically discarded. Because large numbers of devices must be tested during an average production run, and because consumers demand both high quality and low cost, electronic testing equipment and procedures must be as quick and as inexpensive as possible while providing a high degree of accuracy.

For purely digital electronic devices in which all signals of interest are digital, thorough quality testing can be performed quickly and cost effectively during production using conventional digital testers. Typically, digital testers provide sequences of digital test patterns to a device under test and monitor digital output sequences generated by the device. The digital input and output sequences are then used by the digital tester to calculate various device characteristics. Because digital-to-digital operations can be carried out at high speed using well known technology, purely digital devices can be thoroughly tested during production in a timely and cost-effective manner.

For example, FIG. 1(A) is a diagram of a device-testing arrangement 1100 in which a digital tester 1110 is used to directly test a digital DUT 1120. As shown, a digital control line 1115 is coupled between a control output of the digital tester 1110 and a control input of the DUT 1120. A digital input/output connection 1125 is coupled between a digital input/output port of the digital tester 1110 and a digital input/output port of the digital DUT 1120. Though only a single digital control line 1115 is shown, those skilled in the art will appreciate that a plurality of control lines may actually be provided between the digital tester 1110 and the digital DUT 1120. Those skilled in the art will also appreciate that the digital input/output connection 1125 typically includes a plurality of individual connections (e.g., to provide a plurality of bits in a digital word). In practice, the physical connections between the digital tester 1110 and the digital DUT 1120 can be made by placing the digital DUT 1120 in a customized socket mounted on a test platform of the digital tester 1110. The digital tester 1110 can include a micro-controller programmed to evaluate one or more performance characteristics of the digital DUT 1120.

During testing, the digital tester 1110 provides appropriate control signals (e.g., transistor-transistor logic, or TTL, signals) to the digital DUT 1120 via the digital control line(s) 1115 so that the digital DUT 1120 carries out a particular sequence of operations. At the same time, the digital tester 1110 provides and/or receives digital test patterns via the digital input/output connection 1125. By monitoring digital signals produced by the digital DUT 1120, the digital tester 1110 can assess, given the control signals and any input test patterns provided by the digital tester 1110, one or more performance characteristics of the digital DUT. For example, if the digital DUT 1120 is a digital counter, the digital tester 1110 can provide a recurring clock pulse to the DUT 1120 via the digital control line 1115 and simultaneously monitor the digital counter output via the digital input/output connection 1125 to ensure that each increment in the digital count is produced accurately by the digital DUT 1120.

Digital testers such as that shown in FIG. 1(A) are relatively inexpensive and provide for quick and thorough testing of digital devices during production. For example, the time required for such a digital tester to evaluate all 256 possible bit patterns output by an 8-bit digital counter is sufficiently short that each counter in a production run can be completely tested without significantly slowing down the overall production process. However, this is not the case when the FIG. 1(A) digital tester is used to directly test a mixed-signal device having both analog and digital nodes. This is due, in part, to the relatively slow conversion times associated with parametric measuring units in conventional digital testers. Thus, mixed-signal devices which process both digital and analog signals present a more difficult quality-testing challenge, and the high-speed, cost-effective digital-to-digital testing operations described above are not directly applicable.

As a result, conventional testers trade off speed against cost with respect to quality-testing of mixed-signal devices. For example, conventional digital testers which use parametric measuring units provide analog-to-digital and digital-to-analog conversions as necessary so that mixed-signal devices can be tested in a manner analogous to that of digital devices. However, because the conversion times provided by available digital testers are prohibitively long, these digital-tester systems are typically configured to test only a small subset of the overall functionality of a DUT. As a result, the quality assurance provided by such systems is diminished.

For example, FIG. 1(B) is a block diagram of a device-testing arrangement 1200 in which a digital tester 1210 is used to directly test a mixed-signal device 1220 having a digital input and an analog output, such as a digital-to-analog converter. As shown, digital control line 1215 is coupled between a control output of the digital tester 1210 and a control input of the mixed-signal digital-to-analog DUT 1220. Additionally, a digital input connection 1225 is coupled between a digital output port of the digital tester 1210 and a digital input port of the mixed-signal DUT 1220, and an analog output line 1235 is coupled between an analog output of the mixed-signal DUT 1220 and an analog input of the digital tester 1210. As with FIG. 1(A), those skilled in the art will appreciate that each of the digital control line 1215, the digital input connection 1225 and the analog output line 1235 can include a plurality of lines depending upon the precise device being tested.

In operation, the digital tester 1210 provides appropriate control signals to the mixed-signal DUT 1220 via the digital control line(s) 1215 so that the mixed-signal DUT 1220 carries out a particular sequence of operations. At the same time, the digital tester 1210 can provide a sequence of digital test patterns to the digital input of the mixed-signal DUT 1220 via the digital input connection 1225. By monitoring the analog output of the mixed-signal DUT 1220 (e.g., using a standard internal parametric measuring unit), the digital tester 1210 can assess, given the digital control signals and any input test patterns provided by the digital tester 1210, one or more performance characteristics of the mixed-signal DUT 1220.

For example, if the mixed-signal DUT 1220 is a digital-to-analog converter, the digital tester 1210 can provide the converter with a digital input pattern via the digital input connection 1225 and then instruct the converter, via the digital control line 1215, to perform a conversion. Once the conversion is complete, the digital tester 1210 can convert the resulting analog signal, received via the analog output connection 1235, into a digital signal which can be compared to the known digital input pattern to ensure that the converter under test is functioning properly. This sequence of operations can be repeated with multiple digital input patterns to test the converter at different points within its designed range of operation. However, the level of quality assurance which can be obtained using a system such as that depicted in FIG. 1(B) is less than ideal.

As another example, FIG. 1(C) is a block diagram of a device-testing arrangement 1300 in which a digital tester 1310 is used to directly test a mixed-signal device 1320 having an analog input and a digital output, such as an analog-to-digital converter. As shown, a digital control line 1315 is coupled between a control output of the digital tester 1310 and a control input of the analog-to-digital DUT 1320. Additionally, an analog input line 1325 is coupled between an analog output of the digital tester 1310 and an analog input of the mixed-signal DUT 1320, and a digital output connection 1335 is coupled between a digital output port of the mixed-signal DUT 1320 and a digital input port of the digital tester 1310. Again, those skilled in the art will appreciate that each of the digital control line 1315, the analog input line 1325 and the digital output connection 1335 can include a plurality of lines depending upon the precise mixed-signal device being tested.

In operation, the digital tester 1310 provides appropriate control signals to the mixed-signal DUT 1320 via the digital control line(s) 1315 so that the mixed-signal DUT 1320 carries out a particular sequence of operations. At the same time, the digital tester 1310 can provide an analog test signal (e.g., using a parametric measuring unit) to the analog input of the mixed-signal DUT 1320 via the analog input line 1325. By monitoring the digital output of the mixed-signal DUT 1320 via the digital output connection 1335, the digital tester 1310 can assess, given the control signals and any input test signals provided by the digital tester 1310, one or more performance characteristics of the mixed-signal DUT 1320.

For example, if the mixed-signal DUT 1320 is an analog-to-digital converter, the digital tester 1310 can provide the converter with an analog test signal via the analog input line 1325 and then instruct the converter, via the digital control line 1315, to perform a conversion. Once the conversion is complete, the digital tester 1310 can read the resulting digital signal via the digital output connection 1335 and compare it with the digital pattern known to correspond to the analog test signal. This sequence of operations can be repeated with various analog input levels to test the converter at different points within its designed range of operation. However, like the system of FIG. 1(B), the level of quality assurance which can be obtained using a system such as that depicted in FIG. 1(C) is less than ideal.

In summary, the digital tester of FIG. 1(A) is inappropriate for use with mixed-signal devices and, because the digital testers 1210, 1310 of FIGS. 1(B) and 1(C) are not designed for use with analog signals, the time required to test a full range of digital patterns is impractical. As a result, conventional digital-tester systems have been configured as reduced function testers for testing a limited number of test patterns, thereby speeding up the overall testing process while sacrificing quality assurance.

The sacrifice in quality assurance associated with these reduced-function testers can be significant. For example, a converter is ideally tested over its full range of operation to obtain a transfer characteristic, or transfer curve, for the converter. Given the transfer curve, meaningful parameters such as the integral linearity error (ILE) and the differential linearity error (DLE) of the converter can be computed and compared to predefined levels of acceptability. Previous attempts to avoid this sacrifice in quality assurance have resulted in the development of expensive, customized, high-speed mixed-signal device testers.

For example, FIG. 1(D) is a block diagram of a customized device-testing arrangement 1400 in which a mixed-signal tester 1410 is used to directly test a mixed-signal device 1420 operating on both analog and digital signals. As shown, a digital control line 1415 is coupled between a control output of the mixed-signal tester 1410 and a control input of the mixed-signal DUT 1420. Additionally, a digital input/output connection 1425 is coupled between a digital port of the mixed-signal tester 1410 and a digital port of the mixed-signal DUT 1420, and an analog input/output line 1435 is coupled between an analog port of the mixed-signal tester 1410 and an analog port of the mixed-signal DUT 1420. Those skilled in the art will appreciate that each of the digital control line 1415, the digital input/output connection 1425 and the analog input/output line 1435 can actually include a plurality of lines depending upon the precise mixed-signal device being tested.

In operation, the mixed-signal tester 1410 provides appropriate control signals to the mixed-signal DUT 1420 via the digital control line(s) 1415 so that the mixed-signal DUT 1420 carries out a particular sequence of operations. At the same time, the mixed-signal tester 1410 can provide analog and/or digital input test signals to the mixed-signal DUT 1320 via the analog input/output line 1425 and the digital input/output connection 1425. By monitoring the analog and/or digital output of the mixed-signal DUT 1420 (again via the analog input/output line 1425 and the digital input/output connection as appropriate), the mixed-signal tester 1410 can assess, given the control signals and any input test signals provided by the mixed-signal tester 1410, one or more performance characteristics of the mixed-signal DUT 1420.

For example, if the mixed-signal DUT 1420 is an analog-to-digital or digital-to-analog converter, the mixed-signal tester 1410 can provide the converter with an analog or digital input test signal as appropriate, and then instruct the converter via the digital control line 1415 to perform a conversion. Once the conversion is complete, the mixed-signal tester 1410 can receive the resulting analog or digital signal and process it (e.g., using dedicated circuitry within the mixed-signal tester 1410) to ensure that the mixed-signal DUT 1420 is functioning properly.

Because the mixed-signal tester 1410 is specifically configured to work with both analog and digital signals at high speeds, a converter under test can be evaluated over its full range of operation. However, mixed-signal testers such as that depicted in FIG. 1(D) are prohibitively expensive. As a result, quality testing using a system such as that shown in FIG. 1(D) may not be cost effective.

Thus, there is a need for improved methods and apparatus for testing mixed-signal devices in which the functionality of a device under test can be thoroughly tested, both quickly and cost-effectively.

SUMMARY OF THE INVENTION

The present invention is directed to a digital tester interface for coupling a standard digital tester to a mixed-signal device under test such that high speed, thorough testing of a mixed-signal device can be achieved in a cost-effective manner. Exemplary embodiments of the digital tester interface communicate with a digital tester and a device under test, and perform analog-to-digital and digital-to-analog translations between the tester and the device under test in a time efficient manner. As such, these embodiments constitute a hardware accelerator for enabling quick and cost effective quality-testing of mixed-signal devices using inexpensive digital testers. Because the digital tester interface can reduce per-function test time by an order of magnitude as compared to conventional digital testers, mixed-signal devices can be more thoroughly tested and quality assurance levels can be optimized at minimal additional cost. Furthermore, because analog-to-digital and digital-to-analog conversions are performed without relying on a parametric measuring unit within a digital tester, performance calculations are carried out at a much higher resolution as compared to conventional digital testers.

In accordance with exemplary embodiments, a standard digital tester such as that depicted in FIGS. 1(A), 1(B) and 1(C) can be used to provide cost effective and complete quality testing during device production. Generally speaking, a digital tester interface, also referred to herein as a hardware accelerator, can be used in conjunction with a digital tester to significantly increase the speed of mixed-signal device testing at minimal additional cost. By performing analog-to-digital and digital-to-analog conversions external to a digital tester, both increased speed and enhanced resolution can be realized as compared to prior art digital-tester systems. For example, a test system in accordance with exemplary embodiments of the present invention can test the full range of a typical 8-bit analog-to-digital or digital-to-analog converter in approximately 1–2 seconds, or shorter, as compared to the approximately 1 minute required by conventional digital-tester systems.

BRIEF DESCRIPTION OF THE DRAWINGS

The above described and additional features of the present invention will become more apparent from the detailed description of preferred embodiments when read in conjunction with the accompanying drawings, wherein like reference numerals are used to designate like elements, and wherein:

FIG. 1(A) is a block diagram of a conventional digital tester used to directly test a digital device which operates exclusively on digital signals;

FIG. 1(B) is a block diagram of a conventional digital tester used to directly test a mixed-signal device which receives digital signals as inputs and provides analog signals as outputs;

FIG. 1(C) is a block diagram of a conventional digital tester used to directly test a mixed-signal device which receives analog signals as inputs and provides digital signals as outputs;

FIG. 1(D) is a block diagram of a conventional mixed-signal tester used to directly test a mixed-signal device which operates on both analog and digital signals;

FIG. 2(A) is a high-level block diagram of an exemplary device-testing arrangement, in accordance with the teachings of the present invention, in which a digital tester and a digital tester interface are used to test a mixed-signal device which receives digital signals as inputs and provides analog signals as outputs;

FIG. 2(B) is a high-level block diagram of an exemplary device-testing arrangement, in accordance with the teachings of the present invention, in which a digital tester and a digital tester interface are used to test a mixed-signal device which receives analog signals as inputs and provides digital signals as outputs;

FIG. 2(C) is a high-level block diagram of an exemplary device-testing arrangement, in accordance with the teachings of the present invention, in which a digital tester and a digital tester interface are used to test mixed-signal devices which operate on both analog and digital signals;

FIG. 3(A) is a block diagram of an exemplary embodiment of the device-testing arrangement of FIG. 2(A);

FIG. 3(B) is a block diagram of an exemplary embodiment of the device-testing arrangement of FIG. 2(B);

FIG. 3(C) is a block diagram of an exemplary embodiment of the device-testing arrangement of FIG. 2(C);

FIG. 4 is a schematic diagram of an exemplary embodiment of the device-testing arrangement of FIG. 3(C), in which a digital tester and a digital tester interface are used to test analog-to-digital converters and digital-to-analog converters;

FIG. 5(A) is a timing diagram depicting waveforms in a digital-to-analog converter-testing cycle of the exemplary embodiment of FIG. 4;

FIG. 5(B) is a timing diagram depicting waveforms in an analog-to-digital converter-testing cycle of the exemplary embodiment of FIG. 4;

FIG. 6(A) is a flow diagram depicting steps in a digital-to-analog converter-testing cycle of the exemplary embodiment of FIG. 4; and FIG. 6(B) is a flow diagram depicting steps in an analog-to-digital converter-testing cycle of the exemplary embodiment of FIG. 4.

DETAILED DESCRIPTION OF THE PREFERRED EMBODIMENTS

FIG. 2(A) illustrates an exemplary device-testing arrangement 2100 in which a device-testing system 2150, comprising a digital tester 2110 and a digital tester interface 2120, is used to test a mixed-signal device 2130 having a digital input node and an analog output node. As shown, a digital control line 2115 is coupled between a control output of the digital tester 2110 and a control input of the mixed-signal DUT 2130. Additionally, a digital input connection 2125 is coupled between a digital device port of the digital tester 2110 and a digital input node of the mixed-signal DUT 2130. An analog output line 2155 is coupled between an analog output node of the mixed-signal DUT 2130 and an analog input node of the digital tester interface 2120. A digital output connection 2135 is coupled between a digital output port of the digital tester interface 2120 and a digital interface port of the digital tester 2110, and a digital control line 2145 is coupled between a control output of the digital tester 2110 and a control input of the digital tester interface 2120. Those skilled in the art will appreciate that each of the various control and input/output lines can include multiple lines depending upon the precise mixed-signal device being tested.

In operation, the digital tester 2110 provides appropriate control signals to the mixed-signal DUT 2130 via the digital control line(s) 2115 so that the mixed-signal DUT 2130 carries out a particular sequence of operations. At the same time, the digital tester 2110 can provide digital input test patterns to the mixed-signal DUT 2130 via the digital input connection 2125. Additionally, the digital tester 2110 provides appropriate control signals to the digital tester interface 2120 so that the digital tester interface 2120 operates in conjunction with the mixed-signal DUT 2130 and translates analog signals generated by the mixed-signal DUT 2130 into a digital form more suitable for use by the digital tester 2110. As shown, analog signals generated by the mixed-signal DUT 2130 are received at the digital tester interface 2120 via the analog output line 2155, and the corresponding digital signals generated by the digital tester interface 2120 are provided to the digital tester 2110 via the digital output connection 2135.

Exemplary methods by which the digital tester interface 2120 translates analog signals received from the mixed-signal DUT 2130 into appropriate digital signals for use by the digital tester 2110 are described in more detail with reference to FIGS. 3(A) and 4. Note with respect to FIG. 2(A), however, that only digital signals are output by, and input to, the digital tester 2110. Thus, the digital tester 2110 can therefore deal exclusively with digital signals and need not convert between analog and digital signals using a relatively slow, internal parametric measuring unit. By monitoring the digital output of the digital tester interface 2120 via the digital output connection 2135, the digital tester 2110 can assess, given the digital control signals and any input test patterns provided by the digital tester 2110, one or more performance characteristics of the mixed-signal DUT 2130 based solely on digital signals. Advantageously, the digital control signals provided to the digital tester interface 2120 can be implemented straightforwardly as additional bits in a test pattern provided by a standard digital tester.

FIG. 2(B) illustrates an exemplary device-testing arrangement 2200 in which a device-testing system 2250, comprising a digital tester 2210 and a digital tester interface 2220, is used to test a mixed-signal device 2230 having an analog input node and a digital output node. As shown, a digital input/control line 2245 is coupled between a digital interface port of the digital tester 2210 and a digital input port of the digital tester interface 2220. Additionally, an analog input line 2255 is coupled between an analog output node of the digital tester interface 2220 and an analog input node of the mixed-signal DUT 2230. A digital output connection 2225 is coupled between a digital output node of the mixed signal DUT 2230 and a digital device port of the digital tester 2210, and a digital control line 2215 is coupled between a control output of the digital tester 2210 and a control input of the mixed-signal DUT 2230. Again, those skilled in the art will appreciate that each of the various control and input/output lines can include of multiple lines depending upon the precise mixed-signal device being tested.

In operation, the digital tester 2210 provides appropriate control signals to the mixed-signal DUT 2230 via the digital control line(s) 2215 so that the mixed-signal DUT 2230 carries out a particular sequence of operations. At the same time, the digital tester 2210 provides appropriate digital control signals to the digital tester interface 2220 so that the digital tester interface 2220 operates in conjunction with the mixed-signal DUT 2230 and translates digital signals provided by the digital tester 2210 into an analog form suitable for use by the mixed-signal DUT 2230. As shown, digital input/control signals generated by the digital tester 2210 are received at the digital tester interface 2220 via the digital input/control line 2245, and the corresponding analog signals generated by the digital tester interface 2220 are provided to the mixed-signal DUT 2230 via the analog input connection 2255.

Exemplary methods by which the digital tester interface 2220 translates digital signals received from the digital tester 2210 into appropriate analog signals for use by the mixed-signal DUT 2230 are described in more detail with reference to FIGS. 3(B) and 4. As with FIG. 2(A), note with respect to FIG. 2(B) that only digital signals are output by, and input to, the digital tester 2210, such that the digital tester can deal exclusively with digital signals when testing a mixed-signal device. By monitoring the digital output of the mixed-signal DUT 2230 via the digital output connection 2225, the digital tester 2210 can assess, given the digital input and control signals provided by the digital tester 2210, one or more performance characteristics of the mixed-signal DUT 2230 based solely on digital signals. Again, the control and input signals provided to the digital tester interface 2220 can be implemented easily in exemplary embodiments as additional bits in a test pattern generated by a standard digital tester.

FIG. 2(C) is a block diagram of an exemplary device-testing arrangement 2300 in which the beneficial features of the configurations of FIGS. 2(A) and 2(B) have been combined in a single test setup. In FIG. 2(C), a device-testing system 2350, comprising a digital tester 2310 and a digital tester interface 2320, is used to selectively test first and second mixed-signal devices 2330, 2340 which operate on both analog and digital signals. As shown, a digital control line 2315 is coupled between a control output of the digital tester 2310 and a control input of the first mixed-signal DUT 2330. Additionally, a digital input connection 2325 is coupled between a digital output port of the digital tester 2310 and a digital input port of the first mixed-signal DUT 2330, and an analog output line 2355 is coupled between an analog output of the first mixed-signal DUT 2330 and an analog input of the digital tester interface 2320.

A digital output connection 2335 is coupled between a digital output of the digital tester interface 2320 and a digital input port of the digital tester 2310, and a digital input/control line 2345 is coupled between a control output of the digital tester 2310 and a control input of the digital tester interface 2320. Additionally, an analog input line 2385 is coupled between an analog output of the digital tester interface 2320 and an analog input of the second mixed-signal DUT 2340. A digital output connection 2365 is coupled between a digital output port of the second mixed signal DUT 2340 and a digital input port of the digital tester 2310, and a digital control line 2375 is coupled between a control output of the digital tester 2310 and a control input of the second mixed-signal DUT 2340. Those skilled in the art will appreciate that each of the various control and input/output connections can include multiple lines depending upon the precise mixed-signal devices being tested.

In operation, the respective components of FIG. 2(C) operate as described above with respect to FIGS. 2(A) and 2(B). Specifically, the digital tester 2310 is programmed to selectively provide and/or receive digital test patterns and to selectively control the digital tester interface 2320 and the mixed-signal DUTs 2330, 2340 to evaluate one or more performance parameters of one or both of the mixed-signal DUTs 2330, 2340. As in FIGS. 2(A) and 2(B), note that only digital signals pass into and out of the digital tester 2310 so that the digital tester 2310 need not be concerned with time-consuming signal conversions. Advantageously, the system of FIG. 2(C) provides all of the functionality of both of the systems of FIGS. 2(A) and 2(B) while also providing certain economies of scale in terms of a reduced component count within the digital tester interface 2320.

Exemplary embodiments of the system of FIG. 2(C) are described in detail with reference to FIGS. 3(C) and 4. Although two distinct mixed-signal DUTs 2330, 2340 are shown in FIG. 2(C), those skilled in the art will appreciate that such a system can be constructed in practice using, for example, a single test socket. In such case, appropriate sensing or switching apparatus are included to enable the digital tester 2310 to control the digital tester interface 2320 and an inserted device in an appropriate manner.

FIG. 3(A) is a block diagram of an exemplary embodiment of a mixed-signal device testing system such as that of FIG. 2(A). In the device-testing arrangement 3100 of FIG. 3(A), a device-testing system 3150, comprising a digital tester 3110 and a digital tester interface 3120, is used to test a mixed-signal device 3130 having a digital input and an analog output. As shown, the exemplary digital tester interface 3120 comprises an analog-to-digital converter 3140, a digital comparator 3160 and a digital counter 3170. A digital control line 3115 is coupled between a control output of the digital tester 3110 and a control input of the mixed-signal DUT 3130. Additionally, a digital input connection 3125 is coupled between a digital output port of the digital tester 3110 and a digital input port of the mixed-signal DUT 3130, and an analog output line 3155 is coupled between an analog output of the mixed-signal DUT 3130 and an analog input of the analog-to-digital converter 3140.

A digital control line 3145 is coupled between a control output of the digital tester 3110 and a control input of the analog-to-digital converter 3140. A digital test signal connection 3165 is coupled between a digital output port of the analog-to-digital converter 3140 and a first digital input port of the digital comparator 3160. Additionally, a digital output connection 3135 is coupled between a digital output of the digital comparator 3160 and a digital input of the digital tester 3110. A digital control line 3146 is coupled between a control output of the digital tester 3110 and a control input of the digital counter 3170, and a second digital test signal connection 3175 is coupled between a digital output port of the digital counter 3170 and a second digital input port of the digital comparator 3160.

In operation, the digital tester 3110 provides appropriate control signals to the mixed-signal DUT 3130 via the digital control line(s) 3115 so that the mixed-signal DUT 3130 carries out a particular sequence of operations in a conventional manner. The digital tester 3110 can also provide digital input test patterns to the mixed-signal DUT 3130 via the digital input connection 3125 in a conventional manner. Additionally, the digital tester 3110 provides digital control signals to the digital tester interface 3120 so that the digital tester interface 3120 operates in conjunction with the mixed-signal DUT 3130 and converts analog signals generated by the mixed-signal DUT 3130 into a digital signal suitable for use by the digital tester 3110. As shown, an analog signal generated by the mixed-signal DUT 3130 is received at the digital tester interface 3120 via the analog output line 3155, and a corresponding digital signal generated by the digital tester interface 3120 is provided to the digital tester 3110 via the digital output connection 3135.

More specifically, any time the digital tester 3110 requires a sample of the analog signal provided by the mixed-signal DUT 3130 at the analog output line 3155, the digital tester 3110 instructs the analog-to-digital converter 3140, via the digital control line 3145, to perform a conversion and to provide a digital representation of the analog signal output by the mixed-signal DUT 3130 to the digital comparator 3160 via the first digital test connection 3165. Additionally, the digital tester 3110 instructs the digital counter 3170, via the digital control line 3146, to begin counting, for example, up from zero. The digital count output by the digital counter 3170 is also input to the digital comparator 3160 via the second digital test connection 3175.

As long as the digital count output by the digital counter 3170 and the digital representation output by the analog-to-digital converter 3140 are not equal, the digital comparator 3160 outputs a first digital signal (e.g., a 1-bit zero) via the digital output connection 3135. However, when the digital count output by the digital counter 3170 equals the digital representation output by the analog-to-digital converter 3140, the digital comparator 3160 outputs an alternate digital signal (e.g., a 1-bit digital one) via the digital output connection 3135.

Thus, the digital tester 3110 can determine the value of the analog signal output by the mixed-signal DUT 3130 based purely on digital signals. When the digital tester 3110 sees a transition of the digital output from the comparator 3160, the digital tester 3110 uses the output of the digital counter 3170 as the digital representation of the analog signal output by mixed-signal DUT 3130.

To keep track of the digital count output by the counter 3170, the digital tester 3110 can, for example, clear the counter and then monitor the number of count signals (i.e., clocks) required to make the digital count equal to the output of the analog-to-digital converter 3140 (as indicated by the output of the comparator 3160). Alternatively, the count of digital counter 3170 can be supplied to the digital tester. Advantageously, the methods of obtaining a digital sample of an analog signal described herein are much faster than is using an internal parametric measuring unit of the digital tester 3110. Thus, the configuration of FIG. 3(A) can be used to test mixed-signal devices in real time during production. In exemplary embodiments, the digital control signals provided to the digital tester interface 3120 (e.g., a perform-conversion signal for the analog-to-digital converter 3140 and clear and clock signals for the digital counter 3170) can be implemented as additional bits in an overall test pattern provided by the digital tester 3110.

As an example, consider the case in which the mixed-signal DUT 3130 is a digital-to-analog converter. In such case, the digital tester 3110 can provide a digital test pattern to the DUT via the digital input connection 3125 and instruct the DUT to perform a conversion to provide an analog output at the analog output line 3155. Thereafter, the digital tester 3110 can employ the method described above to obtain a digital representation of the analog output of the DUT. Furthermore, due to the relative speed of the above described sampling procedure, the digital tester 3110 can obtain digital samples over the entire range of operation of the converter under test and thereby compute the converter's DLE and ILE in real time during production. An exemplary embodiment of a digital-to-analog converter testing system is further described with reference to FIG. 4.

FIG. 3(B) is a block diagram of an exemplary embodiment of a mixed-signal device testing system such as that of FIG. 2(B). In the device-testing arrangement 3200 of FIG. 3(B), a device-testing system 3250, comprising a digital tester 3210 and a digital tester interface 3220, is used to test a mixed-signal device 3230 having an analog input and a digital output. As shown, the digital tester interface 3220 includes a digital-to-analog converter 3240 and a digital counter 3260. In the figure, a digital control line 3245 is coupled between a control output of the digital tester 3210 and a control input of the digital counter 3260, and a digital input/control line 3246 is coupled between a second control output of the digital tester 3210 and a control input of the digital-to-analog converter 3240.

A digital test signal connection 3285 is coupled between a digital output port of the digital counter 3260 and a digital input port of the digital-to-analog converter 3240, and an analog input connection 3255 is coupled between an analog output of the digital-to-analog converter 3240 and an analog input of the mixed-signal DUT 3230. Additionally, a digital output connection 3225 is coupled between a digital output port of the mixed signal DUT 3220 and a digital input port of the digital tester 3210, and a digital control line 3215 is coupled between a control output of the digital tester 3210 and a control input of the mixed-signal DUT 3230.

In operation, the digital tester 3210 provides appropriate control signals to the mixed-signal DUT 3230 via the digital control line(s) 3215 so that the mixed-signal DUT 3230 carries out a particular sequence of operations. The digital tester 3210 can also receive digital output test patterns from the mixed-signal DUT 3230 via the digital output connection 3225. Additionally, the digital tester 3210 provides appropriate digital control signals to the digital tester interface 3220 so that the digital tester interface 3220 operates in conjunction with the mixed-signal DUT 3230 and converts digital instructions provided by the digital tester 3210 into an analog signal suitable for use by the mixed-signal DUT 3230. As shown, a digital input/control signal generated by the digital tester 3210 is received at the digital tester interface 3220 via the digital input/control line 3246, and a corresponding analog signal generated by the digital tester interface 3220 is provided to the mixed-signal DUT 3230 via the analog input connection 3255.

More specifically, any time the digital tester 3210 must provide an analog signal to the mixed-signal DUT 3230 at the analog input line 3255, the digital tester 3210 instructs the digital counter 3260, via the digital control lines 3245 (e.g., separate clear and clock signals as described above with reference to FIG. 3(A)), to provide a particular digital count to the digital input of the digital-to-analog converter 3240. Once the desired digital count is established, the digital tester 3210 instructs the digital-to-analog converter 3240 to perform a conversion and to provide a corresponding analog signal to the mixed-signal DUT 3230 via the analog input line 3255.

Thus, the digital tester 3210 can provide an analog signal to the mixed-signal DUT 3230 using purely digital signals. Advantageously, exemplary methods of providing an analog signal as described herein are much faster than is using an internal parametric measuring unit of the digital tester 3210. Thus, as with the system of FIG. 3(A), the configuration of FIG. 3(B) can be used to test mixed-signal devices in real time during production. In exemplary embodiments, the digital control signals provided to the digital tester interface 3220 (e.g., a perform-conversion signal for the digital-to-analog converter 3240 and clear and clock signals for the digital counter 3260) can be implemented as additional bits in an overall test pattern provided by the digital tester 3210.

As an example, consider the case in which the mixed-signal DUT 3230 is an analog-to-digital converter. In such case, the digital tester 3210 can employ the method described above to provide an analog input to the DUT. Thereafter, the digital tester 3210 can instruct the DUT to perform a conversion so that the digital tester 3210 can receive the corresponding digital output at the digital output connection 3225. Furthermore, due to the relative speed of the above described sampling procedure, the digital tester 3210 can obtain digital samples over the entire range of operation of the converter under test and thereby compute the converter's DLE and ILE in real time during production. An exemplary embodiment of a analog-to-digital converter testing system is further described with reference to FIG. 4.

FIG. 3(C) is a block diagram of an exemplary embodiment of a mixed-signal device testing system such as that of FIG. 2(C). In the device-testing arrangement 3300 of FIG. 3(C), a device-testing system 3350, comprising a digital tester 3310 and a digital tester interface 3320, is used to test first and second mixed-signal devices 3330, 3340 operating on both analog and digital signals. As shown, the digital tester interface includes an analog-to-digital converter 3360, a digital-to-analog converter 3390, a digital comparator 3370 and a digital counter 3380. In the figure, a digital control line 3315 is coupled between a control output of the digital tester 3310 and a control input of the first mixed-signal DUT 3330, and a digital input connection 3325 is coupled between a digital output port of the digital tester 3310 and a digital input port of the first mixed-signal DUT 3330. Additionally, an analog output connection 3355 is coupled between an analog output of the mixed-signal DUT 3330 and an analog input of the analog-to-digital converter 3360.

A digital control line 3345 is coupled from a control output of the digital tester 3310 to control inputs of the analog-to-digital converter 3360 and the digital-to-analog converter 3390, and an analog input connection 3385 is coupled between an analog output of the digital-to-analog converter 3390 and an analog input of the second mixed-signal DUT 3340. Also, a digital output connection 3365 is coupled between a digital output port of the mixed-signal DUT 3340 and a digital input port of the digital tester 3310, and a digital control line 3375 is coupled between a control output of the digital tester 3310 and a control input of the second mixed-signal DUT 3340.

A digital control line 3346 is coupled between a control output of the digital tester 3310 and a control input of the digital counter 3380, and a digital output connection 3335 is coupled between a digital output of the digital comparator 3370 and a digital input of the digital tester 3310. Additionally, a first digital test signal connection 3395 is coupled between a digital output port of the analog-to-digital converter 3360 and a digital input port of the digital comparator 3370, and a second digital test signal connection 3396 is coupled from a digital output port of the digital counter 3380 to digital input ports of the digital comparator 3370 and the digital-to-analog converter 3390.

In operation, the respective components of FIG. 3(C) operate as described above with respect to FIGS. 3(A) and 3(B). Specifically, the digital tester 3310 is programmed to selectively provide and/or receive digital test patterns and to selectively control the digital tester interface 3320 and the mixed-signal DUTs 3330, 3340 in order to evaluate one or more performance parameters of one or both of the mixed-signal DUTs 3330, 3340. Advantageously, the system of FIG. 3(C) provides all of the functionality of both of the systems of FIGS. 3(A) and 3(B) while also providing an economy of scale in the sense that a single digital tester 3310 and a single digital counter 3380 are used to perform both types of testing. Although two distinct mixed-signal DUTs 3330, 3340 are shown in FIG. 3(C), those skilled in the art will appreciate that such a system can be configured using, for example, a single test device socket. In such case, appropriate sensing or switching apparatus are included to enable the digital tester 3310 to control the digital tester interface 3320 and an inserted device in an appropriate manner.

FIG. 4 is a schematic diagram of an exemplary embodiment of a mixed-signal device testing system such as that of FIG. 3(C). In the device-testing arrangement 4100 of FIG. 4, a digital tester 4175 and a digital tester interface, comprising first and second 8-bit counters 4110, 4120, first and second 8-bit comparators 4130, 4140, a 12-bit digital-to-analog converter 4150 and a 12-bit analog-to-digital converter 4160, are used to test an 8-bit analog-to-digital converter 4115 and an 8-bit digital-to-analog converter 4125. As shown, a positive 15-volt tap of a dual-voltage power supply 4105 is coupled to an input of a positive 5-volt voltage regulator 4180, and a negative 15-volt tap of the dual-voltage power supply 4105 is coupled to an input of a negative 5-volt voltage regulator 4190 and to an input of a negative 12-volt voltage regulator 4170. Outputs of the dual-voltage power supply 4105, the positive 5-volt regulator 4180, the negative 5-volt regulator 4190 and the negative 12-volt regulator 4170 are used to provide supply and reference voltages as appropriate to the counters 4110, 4120, the comparators 4130, 4140 and the converters 4150, 4160.

During testing of an 8-bit digital-to-analog converter (DAC) 4125, the digital tester 4175 first clears the counters 4110, 4120 by providing appropriate digital (i.e., TTL) control signals on CLOCK and CLEAR control lines which are coupled between the digital tester 4175 and clock and clear inputs, respectively, of the digital counters 4110, 4120. As shown, the digital counters 4110, 4120 are connected in parallel to provide a 12-bit digital count on digital test lines DTB0–DTB11. Once the digital counters 4110, 4120 have been cleared, the digital tester 4175 provides the DAC 4125 with an 8-bit digital input pattern (via digital connections which are not shown in FIG. 4) and instructs the DAC 4125 (via a digital control line which also is not shown in the figure) to perform a digital-to-analog conversion. The analog output of the DAC 4125 is fed through first and second amplifier stages 4155, 4165 to an analog input of the 12-bit analog-to-digital converter 4160. Although the first and second amplifier stages 4155, 4165 are shown as unity gain stages in FIG. 4, those skilled in the art will appreciate that the gains of the first and second amplifier stages can be set as necessary to match the output range of the DAC 4125 to the input range of the analog-to-digital converter 4160.

Once the DUT 4125 has performed a conversion and the resulting analog output is provided at the input of the analog-to-digital converter 4160, the digital tester 4175 provides a digital control signal, via a CONVERT control line, to instruct the analog-to-digital converter 4160 to perform a conversion. As shown, the 12-bit digital output DTA0–DTA11 provided by the analog-to-digital converter 4160 is coupled to a first 12-bit digital input provided by a parallel combination of the digital comparators 4130, 4140. Once the 12-bit conversion is complete, the digital tester 4175 uses the CLOCK control line to increment the digital count DTB0–DTB11 provided by the digital counters 4110, 4120. As shown, the digital count DTB0–DTB11 is coupled to a second 12-bit digital input provided by the digital comparators 4130, 4140. Thus, the first comparator 4130 provides a 1-bit digital signal indicating whether the digital output DTA0–DTA11 provided by the analog-to-digital converter 4160 is equal to the digital count DTB0–DTB11 provided by the digital counters 4110, 4120. As shown, the 1-bit indicator is provided to the digital tester 4175 via a COMPARE output line.

Thus, the digital tester 4175 is able to assess the analog value output by the DAC 4125 under test based on the 8-bit digital input pattern provided to the DAC 4125 by the digital tester 4175. By repeating the above described procedure using a set of digital input patterns which span the operating range of the DAC 4125 under test, the digital tester 4175 can generate a transfer curve for the DAC 4125 and thereby compute a DLE value and an ILE value for the DAC 4125. Since all of the input and output signals of the digital tester 4175 are digital, the entire test procedure can be conducted in real time during production. Furthermore, because analog-to-digital conversions are performed external to the digital tester 4175, the test resolution is superior to that provided by conventional digital-tester systems. The 12-bit analog-to-digital converter 4160 can provide four bits for every transition level of the 8-bit DAC 4125, as compared to the one or two bits per level provided by typical digital-tester parametric measuring units.

FIG. 5(A) is a timing diagram depicting waveforms in the DAC testing cycle of the exemplary embodiment of FIG. 4. As shown, during an initial DAC test cycle DA0, the digital tester 4175 uses the CLEAR and CLOCK lines to reset the count provided by the digital counters 4110, 4120. Then, during a next test cycle DA1, the digital tester provides a digital input pattern (Digital In) to the DAC under test and uses a clock line of the DAC under test (DUT Clock) to cause the DAC under test to perform a conversion. During the next three test cycles DA2, DA3, DA4, the digital tester waits for the output of the DAC under test to settle out. Those skilled in the art will appreciate that the number of test cycles required for the DAC output to settle will depend upon the specifications of the device being tested. During a next test cycle DA5, the digital tester 4175 uses the CONVERT line to cause the analog-to-digital converter 4160 to convert the analog output provided by the DAC under test into a 12-bit digital output as described above. In a next test cycle DA6, the digital tester 4175 repeatedly uses the CLOCK line to increment the counter while monitoring the COMPARE output provided by the first digital comparator 4130. Once a match is detected, the digital tester 4175 records the digital count for later computations and resets the counter at test cycle DA7 so that the procedure can be repeated for another digital input pattern.

FIG. 6(A) shows the steps of the above described DAC test cycle in flow chart form. As shown, the procedure starts at step SDA0. The DAC under test is then initialized at step SDA1, and the digital count is reset at step SDA2. At step SDA3, the digital tester 4175 provides a first digital input pattern (e.g., all zeros) to the DAC under test and instructs the DAC under test and the analog-to-digital converter 4160 to perform consecutive conversions. Thereafter, at steps SDA4 and SDA5, the digital tester repeatedly increments the count until it matches the output of the analog-to-digital converter 4160. Once a match is found, the counter state is recorded at step SDA6, and the digital pattern provided to the DAC under test is adjusted (e.g., incremented) at step SDA7. At step SDA8, a determination is made whether a sufficient number of input patterns have been tested. If the previous input pattern is not the last pattern to be tested (e.g., an incremented 8-bit pattern is still less than 256), then the test cycle is repeated from step SDA3. If the previous input pattern is the last pattern to be tested, then appropriate performance parameters (e.g., the DLE and the ILE) for the DAC under test are computed at step SDA9. Thereafter, the process stops at step SDA10.

FIG. 4 further illustrates testing of an 8-bit analog-to-digital converter (ADC) 4115. In operation, the digital tester 4175 first clears the counters 4110, 4120 by providing appropriate digital control signals on the CLOCK and CLEAR control lines. Once the digital counters 4110, 4120 have been cleared, the digital tester 4175 uses the CLOCK line to clock the counters and to obtain a desired digital count DTB0–DTB11 which is provided to the input of the digital-to-analog converter 4150. Thereafter, the digital tester 4175 uses the CONVERT line to instruct the digital-to-analog converter 4150 to perform a conversion. As shown, the analog output of the digital-to-analog converter 4150 is coupled to an analog input of the ADC under test.

Once the digital-to-analog conversion is performed and the resulting analog signal is present at the input of the ADC under test 4115, the digital tester 4175 instructs the ADC 2115 (via a digital control line not shown in the figure) to perform a conversion. The digital tester 4175 then receives the resulting 8-bit digital output of the ADC 4115 (via digital connections which also are not shown in the Figure). The digital tester 4175 can then repeat the procedure and increment the output of the digital counters 4110, 4120, for example, until the digital output pattern provided by the ADC 4115 changes from one state to another.

Thus, as described above with respect to FIG. 3(B), the digital tester 4175 is able to provide an analog value to the ADC 4125 under test and assess the corresponding 8-bit digital output pattern provided by the ADC 4125. By repeating the above described procedure using a range of analog inputs which span the operating range of the ADC 4125 under test, the digital tester 4175 can generate a transfer curve for the ADC 4125 and thereby compute a DLE value and an ILE value for the ADC 4125. Again, since all of the input and output signals of the digital tester 4175 are digital in nature, the entire test procedure can be conducted in real time during production. Furthermore, because digital-to-analog conversions are performed external to the digital tester 4175, the test resolution is superior to that provided by conventional digital-tester systems.

FIG. 5(B) is a timing diagram depicting waveforms in the above described DAC testing cycle of the exemplary embodiment of FIG. 4. As shown, during an initial ADC test cycle AD0, the digital tester 4175 uses the CLEAR and CLOCK lines to reset the count provided by the digital counters 4110, 4120. Then, during a next test cycle AD1, the digital tester 4175 uses the CLOCK line to increment the count output by the digital counters. Thereafter, the digital tester 4175 uses the CONVERT line during test cycle AD2 to cause the digital-to-analog converter 4150 to perform a conversion. During test cycles AD3 and AD4, the digital tester 4175 waits for the output of the digital-to-analog converter 4150 to settle out. Then, during cycle AD5, the digital tester uses a clock control line (DUT Clock) to cause the ADC 4115 under test to perform a conversion. After waiting for the output of the ADC 4115 to settle out during cycle AD6, the digital tester 4175 receives the 8-bit digital output (Digital Out) from the ADC 4115 during test cycle AD7. At cycle AD7, the digital tester 4175 assesses the 8-bit digital output of the ADC 4115 (e.g., to determine whether the output has changed since a previous measurement) and restarts the procedure at test cycle AD0.

FIG. 6(B) shows the steps of an ADC test cycle in flow chart form. As shown, the procedure starts at step SAD0. The ADC under test is then initialized at step SAD1, and the digital count is reset at step SAD2. At steps SAD3 and SAD4, the counter is incremented and the respective conversions are carried out. At step SAD5, the output of the ADC under test is compared to a first preset digital code (e.g., all zeros). If the output of the ADC under test does not equal the preset code, then steps SAD3 and SAD4 are repeated until it does. Once the digital output of the ADC under test equals the preset code, then the state of the counter is recorded at step SAD6. Thereafter, the preset code is adjusted (e.g., incremented) at step SAD7. At step SAD8, a determination is made whether the previous preset code used was the last preset code required for testing the ADC (e.g., an incremented 8-bit preset code is greater than 255). If not, then the above described process is repeated from step SAD3. If so, then appropriate performance parameters (e.g., a DLE value and an ILE value) are computed for the ADC 4115 under test at step SAD9, and processing is terminated at step SAD10.

Thus, the digital tester 4105 of FIG. 4 is able to thoroughly test both DAC and ADC devices using, for example, four additional control signals (i.e., CLOCK, CLEAR, CONVERT and COMPARE). Those skilled in the art will appreciate that the present invention is not limited to the specific exemplary embodiments which have been described herein for purposes of illustration. For example, though the exemplary systems have been described with reference to testing mixed-signal devices having either an analog input and a digital output or a digital input and an analog output, the teachings of the present invention are applicable to testing mixed-signal devices having at least one analog node and one digital node, irrespective of whether any such node serves as an input or an output. In other words, the precise function of the nodes of a mixed-signal device under test are immaterial, and exemplary embodiments of the present invention can be applied to any device in which at least one analog signal and at least one digital signal are to be tested in conjunction.

Note that the embodiment of FIG. 4 also provides for straightforward diagnostic testing of the digital tester interface. Specifically, the analog output VOUTA of the digital-to-analog converter 4150 is switchably coupled to the analog input AIN of the analog-to-digital converter under test 4115 and to a first analog test line AINTEST of the digital tester 4175 via a first relay 4135. Additionally, the analog input AIN1 of the analog-to-digital converter 4160 is switchably coupled to the analog output AOUT of the digital-to-analog converter under test 4125 and to a second analog test line AOUTTEST of the digital tester 4175 via a second relay 4145. As shown, the digital tester 4175 controls operation of the first and second relays via a relay control line labeled DIAGNOSTICS. Thus, the digital tester 4175 can readily perform diagnostic testing of the digital tester interface itself.

For example, using the DIAGNOSTICS control line, the digital tester 4175 can couple the digital-to-analog converter 4150 and the analog-to-digital converter 4160 to the first and second analog test lines AINTEST, AOUTTEST, respectively. Thereafter, the digital tester 4175 can provide digital patterns to the digital-to-analog converter 4150 using the counters 4110, 4120 and assess corresponding analog outputs received at the first analog test line AINTEST to ensure that the analog-to-digital testing features of the digital tester interface are working properly. Additionally, the digital tester 4175 can provide analog signals directly to the analog-to-digital converter 4160 via the second analog test line AOUTTEST and assess corresponding digital patterns using the counters 4110, 4120 and the comparators 4130, 4140 to ensure that the digital-to-analog testing features of the digital tester interface are working properly. Thereafter, the digital tester 4175 can use the DIAGNOSTICS line to couple the digital-to-analog converter 4150 and the analog-to-digital converter 4160 to the devices under test 4115, 4125 so that they can be fully tested as described above.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

I claim:

1. A digital tester interface for testing a device having a digital input node and an analog output node, comprising:

an analog-to-digital converter for receiving an analog output from the analog output node of the device and for converting the analog output into a digital pattern in dependence upon a digital control signal received from a digital tester;

a digital counter for generating a digital count in dependence upon at least one additional digital control signal received from the digital tester; and a digital comparator receiving the digital pattern from said analog-to-digital converter and the digital count from said digital counter and providing a digital output indicating whether the digital pattern and the digital count are identical.

2. A system according to claim 1, wherein the device is an 8-bit digital-to-analog converter and wherein said analog-to-digital converter is a 12-bit converter.

3. A system according to claim 2, wherein said digital counter is a 12-bit counter comprising two concatenated 8-bit counters and wherein said digital comparator is a 12-bit comparator comprising two concatenated 8-bit comparators.

4. A digital tester interface for testing a device having an analog input node and a digital output node, comprising:

a digital counter for generating a digital count in dependence upon at least one digital control signal received from a digital tester; and a digital-to-analog converter for receiving the digital count from said digital counter and for converting the digital count, in dependence upon an additional digital control signal received from the digital tester, into an analog input which is provided to the analog input node of the device.

5. A system according to claim 4, wherein the device is an 8-bit analog-to-digital converter and wherein said digital-to-analog converter is a 12-bit converter.

6. A system according to claim 5, wherein said digital counter is a 12-bit counter comprising two concatenated 8-bit counters.

7. A digital tester interface, comprising:

an analog input node configured to receive an analog input signal from a device under test;

an analog-to-digital converter coupled to the analog input node;

a digital counter;

a digital comparator receiving a digital pattern from said analog-to-digital converter and a digital count from said digital counter and providing a digital output indicating whether the digital pattern and the digital count match;

a digital-to-analog converter receiving the digital count from said digital counter; and an analog output node coupled to said digital-to-analog converter and configured to provide an analog output signal to a device under test.

8. A digital tester interface in accordance with claim 7, further comprising control inputs for receiving control signals from a digital tester, wherein the control signals are used to regulate operation of said analog-to-digital converter, said digital counter and said digital-to-analog converter.

9. A digital tester interface, comprising:

first conversion means for converting an analog output of a device under test into a digital pattern;

counting means for providing a digital count;

means coupled to said first conversion means and said counting means for providing a digital output indicating whether the digital pattern and the digital count are identical; and second conversion means coupled to said counting means for converting the digital count into an analog input for a device under test.

10. A digital tester interface in accordance with claim 9, further comprising means for selectively coupling one of said first conversion means and said second conversion means to said counting means in order to selectively test first and second types of devices, respectively, wherein the first type of device includes a digital input node and an analog output node and wherein the second type of device includes an analog input node and a digital output node.

11. A digital tester interface in accordance with claim 9, further comprising diagnostic switching means for selectively coupling an input of said first conversion means to one of a first analog test line of a digital tester and an analog output of a device under test and for selectively coupling an output of said second conversion means to one of a second analog test line of a digital tester and an analog input of a device under test.

12. A method for testing a device having an analog input node and a digital output node, comprising the steps of:

initializing a digital counter to provide a digital count;

converting the digital count into a corresponding analog signal;

providing the analog signal to the analog node of the device;

instructing the device to perform an operation to provide a digital output at the digital output node corresponding to the analog signal; and computing a performance parameter for the device based on the digital output.

13. The method of claim 12, comprising the additional steps of:

incrementing the digital count;

repeating said steps of converting the digital count, providing the analog signal, instructing the device and incrementing the digital count to obtain a plurality of digital output samples; and computing at least one performance parameter for the device based on the plurality of digital output samples.

14. The method of claim 13, wherein the device is an analog-to-digital converter and wherein the at least one performance parameter includes at least one of a differential linearity error of the device and an integral linearity error of the device.

15. A method for testing a device having a digital input node and an analog output node, comprising the steps of:

providing a digital signal to the digital input node of the device;

instructing the device to perform an operation to provide an analog output at the analog output node corresponding to the digital signal;

converting the analog output into a corresponding digital pattern;

initializing a digital counter to output a digital count;

incrementing the digital count until the digital count matches the digital pattern; and computing a performance parameter for the device based on the digital pattern as indicated by the digital count.

16. The method of claim 15, comprising the additional steps of:

repeating said steps of providing a digital signal, instructing the device, converting the analog output, initializing the digital counter and incrementing the digital count to obtain a plurality of digital pattern samples; and computing at least one performance parameter for the device based on the plurality of digital pattern samples.

17. The method of claim 16, wherein the device is a digital-to-analog converter and wherein the at least one performance parameter includes at least one of a differential linearity error of the device and an integral linearity error of the device.

18. A system for testing a device having an analog output node and a digital input node, comprising;

a digital tester including a digital device port for coupling said digital tester to the digital input node of the device; and a digital tester interface, coupled to a digital interface port of said digital tester, for providing an analog connection to the analog output node of the device and for converting between digital signals at the digital interface port of said digital tester and analog signals at the analog output node of the device, wherein said digital tester interface comprises:

an analog-to-digital converter for receiving an analog output from the analog output node and for converting the analog output into a digital pattern in dependence upon a digital control signal received from said digital tester;

a digital counter for generating a digital count in dependence upon at least one additional digital control signal received from said digital tester; and a digital comparator receiving the digital pattern from said analog-to-digital converter and the digital count from said digital counter and providing a digital output to said digital tester indicating whether the digital pattern and the digital count are identical, wherein said digital tester is programmed to control said digital tester interface and the device and to compute at least one performance parameter for the device based upon digital signal values arising at the digital device port and the digital interface port.

19. A system according to claim 18, wherein the device is an 8-bit digital-to-analog converter and wherein said analog-to-digital converter is a 12-bit converter.

20. A system according to claim 19, wherein said digital counter is a 12-bit counter comprising two concatenated 8-bit counters and wherein said digital comparator is a 12-bit comparator comprising two concatenated 8-bit comparators.

21. A system for testing a device having an analog input node and a digital output node, comprising;

a digital tester including a digital device port for coupling said digital tester to the analog input node of the device; and a digital tester interface, coupled to a digital interface port of said digital tester, for providing an analog connection to the analog input node of the device and for converting between digital signals at the digital interface port of said digital tester and analog signals at the analog input node of the device, wherein said digital tester interface comprises:

a digital counter for generating a digital count in dependence upon at least one digital control signal received from said digital tester; and a digital-to-analog converter for receiving the digital count from said digital counter and for converting the digital count, in dependence upon an additional digital control signal received from said digital tester, into an analog input which is provided to the analog input node of the device, wherein said digital tester is programmed to control said digital tester interface and the device and to compute at least one performance parameter for the device based upon digital signal values arising at the digital device port and the digital interface port.

22. A system according to claim 21, wherein the device is an 8-bit analog-to-digital converter and wherein said digital-to-analog converter is a 12-bit converter.

23. A system according to claim 22, wherein said digital counter is a 12-bit counter comprising two concatenated 8-bit counters.

* * * * *